United States Patent
Ramkumar et al.

(10) Patent No.: US 9,893,172 B2
(45) Date of Patent: *Feb. 13, 2018

(54) METHODS TO INTEGRATE SONOS INTO CMOS FLOW

(71) Applicant: Cypress Semiconductor Corporation, San Jose, CA (US)

(72) Inventors: Krishnaswamy Ramkumar, San Jose, CA (US); Venkatraman Prabhakar, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 14/576,657

(22) Filed: Dec. 19, 2014

(65) Prior Publication Data

US 2015/0287811 A1    Oct. 8, 2015

Related U.S. Application Data

(63) Continuation of application No. 14/305,137, filed on Jun. 16, 2014, now Pat. No. 8,916,432.
(Continued)

(51) Int. Cl.
*H01L 21/336* (2006.01)
*H01L 29/78* (2006.01)
(Continued)

(52) U.S. Cl.
CPC .... *H01L 29/66833* (2013.01); *H01L 21/0214* (2013.01); *H01L 21/0217* (2013.01);
(Continued)

(58) Field of Classification Search
CPC ......... H01L 21/28282; H01L 21/26513; H01L 21/0214; H01L 21/0217; H01L 21/31111;
(Continued)

(56) References Cited

U.S. PATENT DOCUMENTS 4,306,353 A * 12/1981 Jacobs .................. H01L 21/033
257/324
4,319,395 A * 3/1982 Lund .................. H01L 21/0332
257/346
(Continued)

FOREIGN PATENT DOCUMENTS

CN       101958323 A       1/2011
JP       6-181218      *   6/1994  .......... H01L 21/336
(Continued)

OTHER PUBLICATIONS

International Search Report for foreign application No. PCT/US14/66397 dated Dec. 12, 2014, 3 pages.
(Continued)

*Primary Examiner* — Mary Wilczewski

(57) ABSTRACT

A method of forming a transistor is described. In one embodiment the method includes: forming a channel of a transistor in a surface of a substrate; forming a dielectric stack including a first oxide layer overlying the surface of the substrate, a middle layer comprising nitride overlying the first oxide layer and a second oxide layer overlying the middle layer; forming over the dielectric stack a mask exposing source and drain (S/D) regions of the transistor; etching the dielectric stack through the mask to thin the dielectric stack by removing the second oxide layer and at least a first portion of the middle layer in S/D regions of the transistor; and implanting dopants into S/D regions of the transistor through the thinned dielectric stack to form a lightly-doped drain (LDD) adjacent to the channel of the transistor. Other embodiments are also described.

17 Claims, 14 Drawing Sheets

Related U.S. Application Data

(60) Provisional application No. 61/929,723, filed on Jan. 21, 2014.

(51) Int. Cl.

| | | |
|---|---|---|
| *H01L 29/792* | (2006.01) | |
| *H01L 29/66* | (2006.01) | |
| *H01L 27/11563* | (2017.01) | |
| *H01L 21/28* | (2006.01) | |
| *H01L 27/11573* | (2017.01) | |
| *H01L 21/02* | (2006.01) | |
| *H01L 21/265* | (2006.01) | |
| *H01L 21/311* | (2006.01) | |
| *H01L 29/423* | (2006.01) | |
| *H01L 29/51* | (2006.01) | |
| *H01L 21/762* | (2006.01) | |

(52) U.S. Cl.
CPC .. *H01L 21/26513* (2013.01); *H01L 21/28282* (2013.01); *H01L 21/31111* (2013.01); *H01L 21/76224* (2013.01); *H01L 27/11563* (2013.01); *H01L 27/11573* (2013.01); *H01L 29/42348* (2013.01); *H01L 29/513* (2013.01); *H01L 29/518* (2013.01); *H01L 29/6653* (2013.01); *H01L 29/6656* (2013.01); *H01L 29/66575* (2013.01); *H01L 29/792* (2013.01)

(58) Field of Classification Search
CPC ............... H01L 29/513; H01L 29/518; H01L 29/66833; H01L 29/6653; H01L 29/6656; H01L 29/792; H01L 29/42348; H01L 29/66575; H01L 27/11563; H01L 27/11573
USPC ......................................................... 438/216
See application file for complete search history.

(56) References Cited

U.S. PATENT DOCUMENTS

| | | | | |
|---|---|---|---|---|
| 5,120,670 A | * | 6/1992 | Bergmont | H01L 21/28273 257/E21.209 |
| 5,168,334 A | * | 12/1992 | Mitchell | H01L 27/115 257/324 |
| 5,349,221 A | * | 9/1994 | Shimoji | G11C 16/0466 257/324 |
| 5,677,206 A | * | 10/1997 | Lee | H01L 29/78621 257/E21.413 |
| 5,966,603 A | * | 10/1999 | Eitan | H01L 27/11568 257/E21.679 |
| 6,069,382 A | | 5/2000 | Rahim | |
| 6,297,096 B1 | * | 10/2001 | Boaz | H01L 21/28282 257/E21.679 |
| 6,348,711 B1 | * | 2/2002 | Eitan | G11C 11/5671 257/316 |
| 6,399,446 B1 | * | 6/2002 | Rangarajan | H01L 27/115 257/E21.679 |
| 6,410,388 B1 | * | 6/2002 | Kluth | H01L 27/11521 257/E21.682 |
| 6,417,081 B1 | * | 7/2002 | Thurgate | H01L 27/115 257/E21.679 |
| 6,436,768 B1 | * | 8/2002 | Yang | H01L 21/2652 257/E21.423 |
| 6,468,865 B1 | * | 10/2002 | Yang | H01L 27/115 257/314 |
| 6,541,816 B2 | * | 4/2003 | Ramsbey | H01L 27/105 257/324 |
| 6,562,683 B1 | * | 5/2003 | Wang | H01L 21/26586 257/E21.252 |
| 6,806,117 B2 | | 10/2004 | King | |
| 6,808,991 B1 | * | 10/2004 | Tung | H01L 27/11568 257/E21.679 |
| 6,867,463 B2 | | 3/2005 | Chang | |
| 6,869,844 B1 | * | 3/2005 | Liu | H01L 27/0248 257/173 |
| 6,908,815 B2 | * | 6/2005 | Ye | H01L 21/76897 257/E21.507 |
| 6,958,272 B2 | | 10/2005 | Lingunis et al. | |
| 6,962,849 B1 | | 11/2005 | Kamal et al. | |
| 6,989,320 B2 | * | 1/2006 | Qian | H01L 27/11568 257/E21.679 |
| 7,015,101 B2 | | 3/2006 | Zheng et al. | |
| 7,176,113 B1 | | 2/2007 | Wong et al. | |
| 7,217,972 B2 | * | 5/2007 | Mori | H01L 21/28282 257/314 |
| 7,227,234 B2 | | 6/2007 | Roizin et al. | |
| 7,253,046 B2 | | 8/2007 | Higashi et al. | |
| 7,320,920 B2 | | 1/2008 | Kim et al. | |
| 7,410,857 B2 | | 8/2008 | Higashi et al. | |
| 7,501,683 B2 | | 3/2009 | Lai et al. | |
| 7,514,323 B2 | | 4/2009 | Dobuzinsky et al. | |
| 7,642,158 B2 | | 1/2010 | Parascandola et al. | |
| 7,678,674 B1 | * | 3/2010 | Sinha | H01L 21/26586 257/E21.147 |
| 7,763,935 B2 | | 7/2010 | Shih et al. | |
| 7,791,129 B2 | * | 9/2010 | Terai | G11C 16/0466 257/323 |
| 7,799,670 B2 | | 9/2010 | Ramkumar et al. | |
| 7,816,728 B2 | | 10/2010 | Ho et al. | |
| 7,838,923 B2 | | 11/2010 | Lue | |
| 7,872,299 B2 | * | 1/2011 | Won | H01L 27/115 257/326 |
| 8,030,166 B2 | | 10/2011 | Lue | |
| 8,093,128 B2 | | 1/2012 | Koutny et al. | |
| 8,120,095 B2 | | 2/2012 | Ho et al. | |
| 8,143,129 B2 | | 3/2012 | Ramkumar et al. | |
| 8,163,660 B2 | | 4/2012 | Puchner et al. | |
| 8,409,950 B1 | | 4/2013 | Shea et al. | |
| 8,441,063 B2 | * | 5/2013 | Fang | H01L 21/28282 257/324 |
| 8,629,025 B2 | | 1/2014 | Chen et al. | |
| 8,679,927 B2 | | 3/2014 | Ramkumar et al. | |
| 8,685,813 B2 | | 4/2014 | Ramkumar | |
| 8,722,496 B1 | * | 5/2014 | Roizin | H01L 21/28282 438/142 |
| 8,796,098 B1 | | 8/2014 | Ramkumar et al. | |
| 8,883,624 B1 | * | 11/2014 | Ramkumar | H01L 21/28282 257/E21.423 |
| 8,916,432 B1 | * | 12/2014 | Ramkumar | H01L 21/28282 257/E21.679 |
| 9,202,701 B1 | * | 12/2015 | Chou | H01L 29/66833 |
| 2002/0016081 A1 | * | 2/2002 | Aloni | H01L 21/31116 438/714 |
| 2002/0119645 A1 | * | 8/2002 | Chang | H01L 21/26586 438/514 |
| 2002/0146885 A1 | * | 10/2002 | Chen | H01L 27/115 438/288 |
| 2002/0164855 A1 | * | 11/2002 | Pan | H01L 29/66833 438/257 |
| 2002/0182829 A1 | * | 12/2002 | Chen | H01L 21/26586 438/514 |
| 2003/0040152 A1 | * | 2/2003 | Liu | H01L 27/115 438/239 |
| 2003/0067032 A1 | * | 4/2003 | Caprara | H01L 27/115 257/324 |
| 2003/0232507 A1 | | 12/2003 | Chen | |
| 2004/0043622 A1 | * | 3/2004 | Chen | H01L 27/11521 438/735 |
| 2004/0082198 A1 | | 4/2004 | Nakamura et al. | |
| 2004/0108540 A1 | * | 6/2004 | Yoshino | H01L 27/11568 257/315 |
| 2004/0119108 A1 | | 6/2004 | Chang | |
| 2005/0214996 A1 | * | 9/2005 | Yoshino | H01L 27/11568 438/197 |
| 2005/0255651 A1 | * | 11/2005 | Qian | H01L 27/11568 438/257 |
| 2006/0091424 A1 | * | 5/2006 | Strassburg | H01L 27/11568 257/208 |

(56) References Cited

U.S. PATENT DOCUMENTS

| | | | |
|---|---|---|---|
| 2006/0205148 A1* | 9/2006 | Deppe | H01L 21/28282 438/257 |
| 2006/0211188 A1* | 9/2006 | Lusky | H01L 27/115 438/201 |
| 2006/0261418 A1* | 11/2006 | Eitan | H01L 29/66833 257/390 |
| 2006/0281255 A1* | 12/2006 | Chiu | H01L 21/26586 438/257 |
| 2006/0292800 A1 | 12/2006 | Shih et al. | |
| 2007/0026621 A1 | 2/2007 | Cho et al. | |
| 2007/0048940 A1* | 3/2007 | Eitan | H01L 21/0337 438/257 |
| 2007/0173017 A1* | 7/2007 | Eitan | H01L 27/11568 438/257 |
| 2008/0116447 A1* | 5/2008 | Lojek | H01L 21/28282 257/24 |
| 2008/0145985 A1 | 6/2008 | Chi | |
| 2008/0150008 A1 | 6/2008 | Kim et al. | |
| 2008/0283905 A1 | 11/2008 | Won | |
| 2009/0181530 A1 | 7/2009 | Lisiansky et al. | |
| 2010/0041222 A1 | 2/2010 | Puchner et al. | |
| 2013/0178031 A1 | 7/2013 | Ramkumar et al. | |
| 2014/0091383 A1 | 4/2014 | Chen et al. | |
| 2014/0103418 A1 | 4/2014 | Puchner et al. | |
| 2014/0209994 A1* | 7/2014 | Roizin | H01L 29/792 257/324 |
| 2015/0287811 A1* | 10/2015 | Ramkumar | H01L 21/28282 438/287 |

FOREIGN PATENT DOCUMENTS

| | | | | |
|---|---|---|---|---|
| JP | 2006-54399 | * | 2/2006 | H01L 21/8247 |
| KR | 1020100080244 A | | 7/2010 | |
| WO | 2013020576 A1 | | 2/2013 | |
| WO | 2013149669 A1 | | 10/2013 | |

OTHER PUBLICATIONS

USPTO Notice of Allowance for U.S. Appl. No. 14/305,137 dated Aug. 18, 2014; 9 pages.
Written Opinion of the International Searching Authority for International Application No. PCT/US14/66397 dated Dec. 12, 2014, 3 pages.
Jeong-Mo Hwang, "Bringing Non-Volatile Memory Blocks to SOCS Using the Sonos Process", Simtek Corporation; 11 pages.
KIPO Office Action for Korean Patent Application No. 10-2016-7015253 dated Nov. 14, 2017; 5 pages.
German Exam Report for German Application No. 112014006222.7 dated Dec. 11, 2017; 12 pages.

* cited by examiner

METHODS TO INTEGRATE SONOS INTO CMOS FLOW

CROSS-REFERENCE TO RELATED APPLICATIONS

This application is a continuation of U.S. patent application Ser. No. 14/305,137, filed Jun. 16, 2014, which claims the benefit of priority under 35 U.S.C. 119(e) to U.S. Provisional Patent Application Ser. No. 61/929,723, filed Jan. 21, 2014, all of which are incorporated by reference herein in their entirety.

TECHNICAL FIELD

The present disclosure relates generally to semiconductor devices, and more particularly to memory cells including embedded or integrally formed SONOS based non-volatile memory (NVM) transistors and metal-oxide-semiconductor (MOS) transistors and methods for fabricating the same.

BACKGROUND

For many applications, such as system-on-chip (SOC) architecture, it is desirable to integrate logic devices and interface circuits based upon metal-oxide-semiconductor (MOS) field-effect transistors and non-volatile memory (NVM) devices on a single chip or substrate. MOS transistors are typically fabricated using a standard or baseline complimentary-metal-oxide-semiconductor (CMOS) process flows. NVM devices can include silicon-oxide-nitride-oxide-semiconductor (SONOS) based transistors, including charge-trapping gate stacks in which a stored or trapped charge changes a threshold voltage of the non-volatile memory transistor to store information as a logic 1 or 0. The integration of these dissimilar transistors in SOC architecture is challenging and becomes even more problematic as the transistors are scaled to smaller geometries.

SUMMARY

Methods of forming memory cells including non-volatile memory (NVM) and MOS transistors are described. In one embodiment the method includes: depositing and patterning a gate layer over a dielectric stack on a substrate to form a gate of a NVM transistor, the dielectric stack including a tunneling layer overlying a surface of the substrate, a charge-trapping layer overlying the tunneling layer and a blocking layer overlying the charge-trapping layer; forming a mask exposing source and drain (S/D) regions of the NVM transistor; etching the dielectric stack through the mask to thin the dielectric stack by removing the blocking layer and at least a first portion of the charge-trapping layer in S/D regions of the NVM transistor; and implanting dopants into S/D regions of the NVM transistor through the thinned dielectric stack to form a lightly-doped drain adjacent to the gate of the NVM transistor.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

Embodiments of methods of integrating a non-volatile memory (NVM) transistor into a complimentary metal-oxide-semiconductor (CMOS) fabrication process or process flow to produce memory cells are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

The NVM transistor may include memory transistors or devices implemented using Silicon-Oxide-Nitride-Oxide-Silicon (SONOS) or Metal-Oxide-Nitride-Oxide-Silicon (MONOS) technology.

Figure 1:
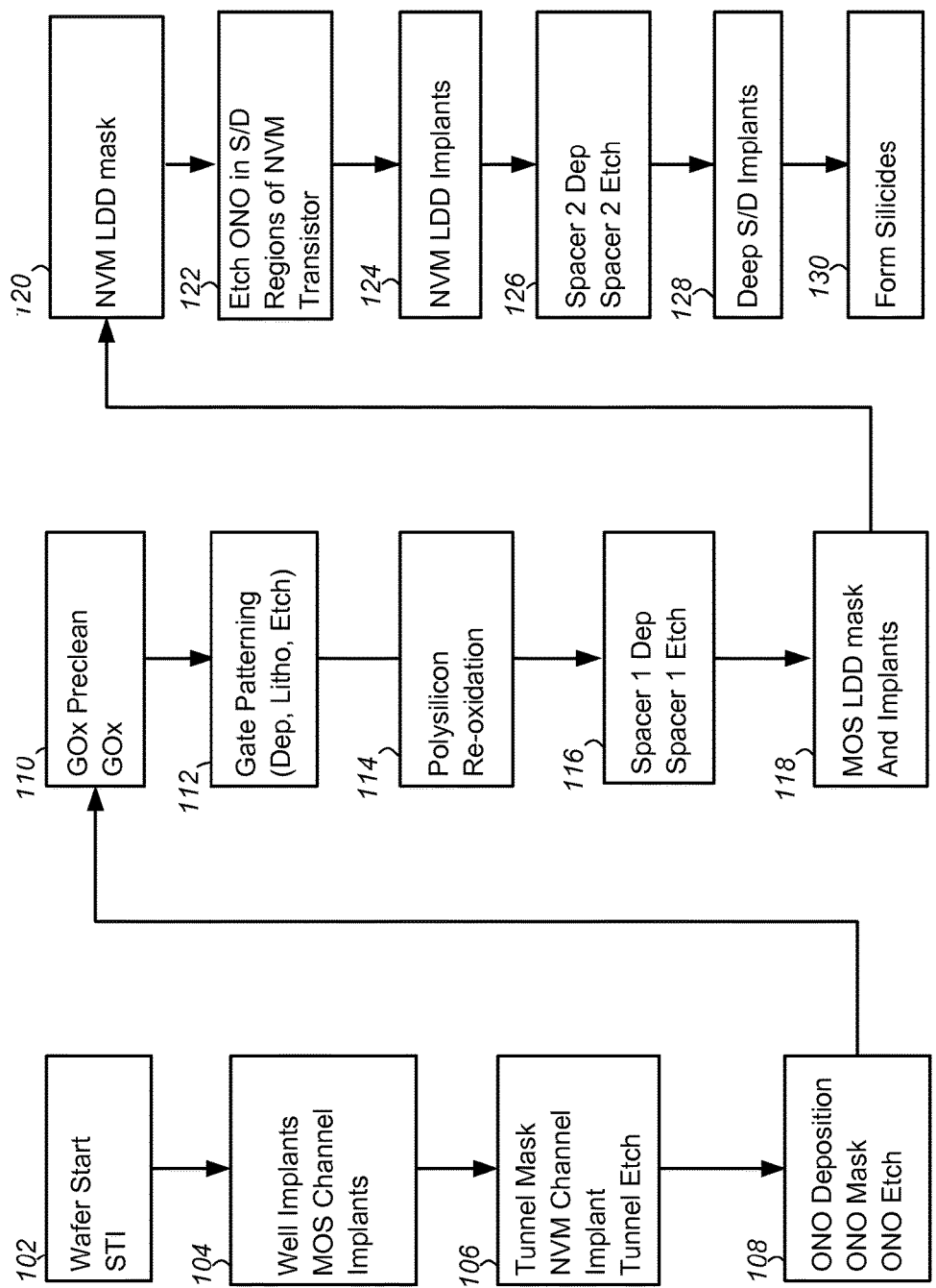
FIG. 1 is a flowchart illustrating an embodiment of a method for fabricating a memory cell including a non-volatile memory (NVM) transistor and a metal-oxide-semiconductor (MOS) transistor including removing or thinning a dielectric stack in source and drain regions of the NVM transistor prior to forming a lightly-doped drain (LDD) adjacent to a gate of the NVM transistor using a NVM LDD mask.
Figure 2A:
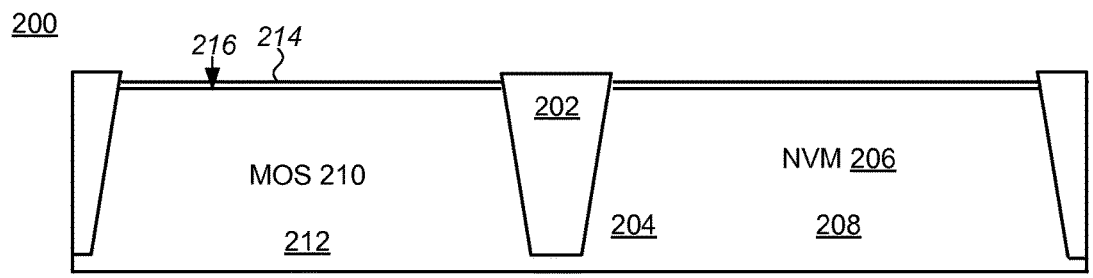
FIGS. 2A-2R are block diagrams illustrating cross-sectional views of a portion of a memory cell during fabrication of the memory cell according to the method of FIG. 1.

An embodiment of a method for integrating or embedding a NVM transistor into a CMOS process flow will now be described in detail with reference to FIG. 1 and FIGS. 2A through 2R. FIG. 1 is a flowchart illustrating an embodiment of a method or process flow in which a lightly doped drain (LDD) mask for the NVM transistor, or NVM LDD mask, is used to thin if not remove a dielectric stack from source and drain regions of the NVM transistor before implanting ions into source and drain (S/D) regions of the NVM transistor to form LDDs for the NVM transistor. In this embodiment, first spacers (spacer 1) are formed adjacent to sidewalls of gates of the NVM and metal-oxide-semiconductor (MOS) transistors prior to thinning the dielectric stack. FIGS. 2A-2R are block diagrams illustrating cross-sectional views of a portion of a memory cell 200, including a NVM transistor and MOS transistors, during fabrication of the memory cell according to the method of FIG. 1.

Referring to FIG. 1 and FIG. 2A, the process begins with forming a number of isolation structures 202 in a wafer or substrate 204 (step 102). The isolation structures 202 isolate the memory cell being formed from memory cells formed in adjoining areas (not shown) of the substrate 204 and/or isolate a NVM transistor 206 being formed in a first or NVM region 208 of the substrate from one or more MOS transistors 210 (only one of which is shown) being formed in an adjoining second or MOS region 212. The isolation structures 202 include a dielectric material, such as an oxide or nitride, and may be formed by any conventional technique, including but not limited to shallow trench isolation (STI) or local oxidation of silicon (LOCOS). The substrate 204 may be a bulk wafer composed of any single crystal or polycrystalline material suitable for semiconductor device fabrication, or may include a top epitaxial layer of a suitable material formed on a substrate. Suitable materials include, but are not limited to, silicon, germanium, silicon-germanium or a III-V compound semiconductor material.

Generally, as in the embodiment shown, a pad oxide 214 is formed over a surface 216 of the substrate 204 in both the NVM region 208 and the MOS region. The pad oxide 214 can be silicon dioxide ($SiO_2$) having a thickness of from about 10 nanometers (nm) to about 20 nm and can be grown by a thermal oxidation process or in-situ steam generation (ISSG).

Figure 2B:
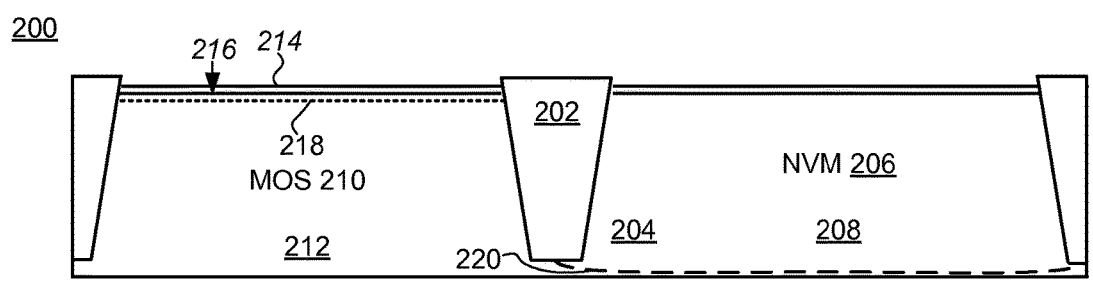

Referring to FIG. 1 and FIG. 2B, dopants are then implanted into substrate 204 through the pad oxide 214 to form a well in the NVM region 208, and to form a channel 218 for the MOS transistor 210 that will be formed in the MOS region 212 (step 104). Optionally or alternatively, the well can be formed in the MOS region 212, or concurrently formed in both the NVM region 208 and the MOS region 212. The dopants implanted may be of any type and concentration, and may be implanted at any energy, including energies necessary to form wells or deep wells for an NVM transistor 206 and/or MOS transistor 210, and to form channels for the MOS transistor. In a particular embodiment illustrated in FIG. 2B, dopants of an appropriate ion species are implanted to form a deep N-well 220 in the NVM region. It is further to be understood that the wells are formed by depositing a mask layer, such as a photoresist or PR layer above the surface 216 of the substrate 204, and patterning the mask layer using standard lithographic techniques prior to the appropriate ion species.

Channels 218 for the MOS transistor 210, are formed in the MOS regions 212 of the substrate 204. As with the well implant, the channels 218 are formed by depositing and patterning a mask layer, such as a photoresist layer above the surface 216 of the substrate 204, and implanting an appropriate ion species at an appropriate energy to an appropriate concentration. For example, $BF_2$ can be implanted at an energy of from about 10 to about 100 kilo-electron volts (keV), and a dose of from about 1e12 $cm^{-2}$ to about 1e14 $cm^{-2}$ to form an N-type MOS (NMOS) transistor. A P-type MOS (PMOS) transistor may likewise be formed by implantation of Arsenic or Phosphorous ions at any suitable dose and energy.

Figure 2C:
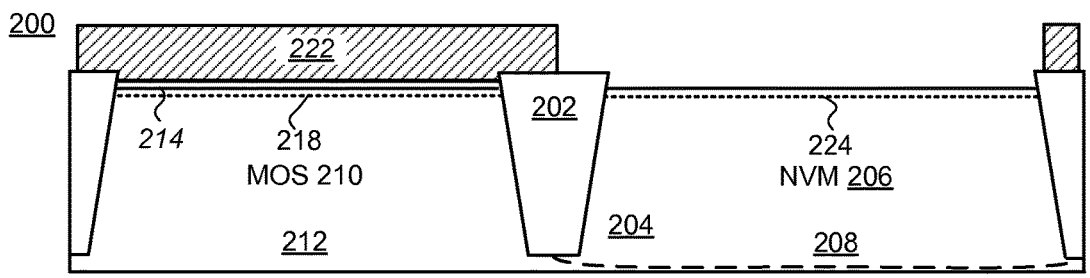

Next, referring to FIG. 1 and FIG. 2C a patterned tunnel mask 222 is formed on or overlying the MOS region 212, and dopants of an appropriate, energy and concentration are implanted through a window or opening in the tunnel mask to form a channel 224 for a NVM transistor 206, and the tunnel mask and the pad oxide 214 overlying the NVM region 208 removed (step 106). The tunnel mask 222 can include a photoresist layer, or a hard mask formed, from a patterned nitride or silicon-nitride layer.

In one embodiment, the channel 224 can be implanted with boron ions ($BF_2$) at an energy of from about 50 to about 500 kilo-electron volts (keV), and a dose of from about 5e11 $m^{-2}$ to about 5e12 $cm^{-2}$ to form a p-channel NVM transistor 206. Alternatively, Arsenic or Phosphorous can be implanted through the pad oxide 214 to form a n-channel NVM transistor 206.

The pad oxide 214 over the NVM region 208 is removed through the tunnel mask 222, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. A photoresist tunnel mask 222 can be ashed or stripped using oxygen plasma. A hard mask can be removed using a wet or dry etch process.

Figure 2D:
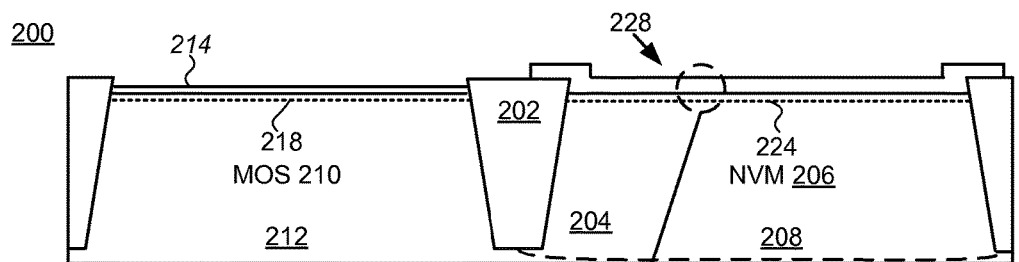
Figure 2E:
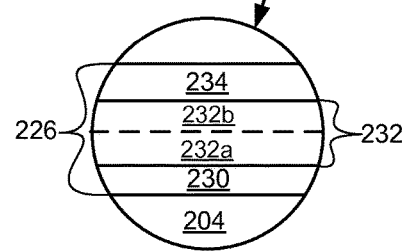

Referring to FIG. 1 and FIGS. 2D-2E, a number of dielectric layers, such as a number of oxide-nitride-oxide (ONO) layers, shown collectively as ONO layers 226, are formed or deposited over the surface 216 of the substrate 204, an ONO mask (not shown) formed on or overlying the ONO layers, and the ONO layers etched to remove the ONO layers from the MOS region 212 forming a dielectric stack 228 in the NVM region 208 (step 108).

Referring to the detail of the ONO layers 226 shown in FIG. 2E, the dielectric or ONO deposition begins with the formation of a tunneling layer 230 over at least the channel 224 of a NVM transistor 206 in the NVM region 208 of the substrate 204. The tunneling layer 230 may be any material and have any thickness suitable to allow charge carriers to tunnel into an overlying charge-trapping layer under an applied gate bias while maintaining a suitable barrier to leakage when the NVM transistor 206 is unbiased. In certain embodiments, tunneling layer 230 is silicon dioxide, silicon oxy-nitride, or a combination thereof and can be grown by a thermal oxidation process, using ISSG or radical oxidation.

In one embodiment a silicon dioxide tunneling layer 230 may be thermally grown in a thermal oxidation process. For example, a layer of silicon dioxide may be grown utilizing dry oxidation at 750 degrees centigrade (° C.)-800° C. in an oxygen containing gas or atmosphere, such as oxygen ($O_2$) gas. The thermal oxidation process is carried out for a duration approximately in the range of 50 to 150 minutes to effect growth of a tunneling layer 230 having a thickness of from about 1.0 nanometers (nm) to about 3.0 nm by oxidation and consumption of the exposed surface of substrate.

In another embodiment a silicon dioxide tunneling layer 230 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1000° C. at a pressure approximately in the range of about 0.5 to about 5 Torr to form radicals, such as, an OH radical, an $HO_2$ radical or an O diradical, at the surface of substrate. The radical oxidation process is carried out for a duration approximately in the range of about 1 to about 10 minutes to effect growth of a tunneling layer 230 having a thickness of from about 1.0 nanometers (nm) to about 4.0 nm by oxidation and consumption of the exposed surface of substrate. It will be understood that in this and in subsequent figures the thickness of tunneling layer 230 is exaggerated relative to the pad oxide 214, which is approximately 7 times thicker, for the purposes of clarity. A tunneling layer 230 grown in a radical oxidation process is both denser and is composed of substantially fewer hydrogen atoms/$cm^3$ than a tunneling layer formed by wet oxidation techniques, even at a reduced thickness. In certain embodiments, the radical oxidation process is carried out in a batch-processing chamber or furnace capable of processing multiple substrates to provide a high quality tunneling layer 230 without impacting the throughput (wafers/hr.) requirements that a fabrication facility may require.

In another embodiment, tunneling layer 230 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunneling layer 230 is a multilayer tunneling layer including at least a bottom layer of a material such as, but not limited to, silicon dioxide or silicon oxy-nitride and a top layer of a high-k material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2E, a charge-trapping layer 232 is formed on or overlying the tunneling layer 230. Generally, as in the embodiment shown, the charge-trapping layer is a multilayer charge-trapping layer comprising multiple layers including at least an oxygen-rich, substantially charge trap free lower or first charge-trapping layer 232a closer to the tunneling layer 230, and an upper or second charge-trapping layer 232b that is silicon-rich and oxygen-lean relative to the first charge-trapping layer and comprises a majority of a charge traps distributed in multilayer charge-trapping layer.

The first charge-trapping layer 232a of a multilayer charge-trapping layer 232 can include a silicon nitride ($Si_3N_4$), silicon-rich silicon nitride or a silicon oxy-nitride ($SiO_xN_y$ ($H_z$)). For example, the first charge-trapping layer 232a can include a silicon oxynitride layer having a thickness of between about 1.5 nm and about 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 232b of the multilayer charge-trapping layer is then formed over the first charge-trapping layer 232a. The second charge-trapping layer 232b can include a silicon nitride and silicon oxy-nitride layer having a stoichiometric composition of oxygen, nitrogen and/or silicon different from that of the first charge-trapping layer 232a. The second charge-trapping layer 232b can include a silicon oxynitride layer having a thickness of between about 2.0 nm and about 10.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

Referring again to FIG. 2E, the number of dielectric layers further includes a blocking dielectric layer or blocking layer 234 that is formed on or overlying the charge-trapping layer 232. In one embodiment, the blocking layer 234 can include an oxidized portion of the silicon nitride of the underlying second charge-trapping layer 232b, which is subsequently oxidized by in-situ-steam-generation (ISSG), or radical oxidation to form the blocking layer 234. In other embodiments, the blocking layer 234 can include a silicon oxide ($SiO_2$) or a silicon oxynitride (SiON), deposited by CVD, and performed in a batch or single substrate processing chamber with or without an ignition event such as plasma. The blocking layer 234 can be a single layer of silicon oxide, having a substantially homogeneous composition, a single layer of silicon oxynitride having a gradient in stoichiometric composition, or, as in embodiments described below, can be a multilayer blocking layer including at least a lower or first blocking layer overlying the second charge-trapping layer 232b, and a second blocking layer overlying the first blocking layer.

In one embodiment, the blocking layer 234 can include a silicon nitride, a silicon-rich silicon nitride or a silicon-rich silicon oxynitride layer having a thickness of between 2.0 nm and 4.0 nm formed by a CVD process using $N_2O$/$NH_3$ and DCS/$NH_3$ gas mixtures.

The ONO mask (not shown) can include a photoresist layer patterned using standard lithographic techniques to expose the ONO layers 226 in the MOS region 212, and using any suitable wet or dry etch process including one or more steps to remove the ONO layers from the MOS region 212 to stop on the pad oxide 214. For example, in one embodiment the dry etch process can include, for example, a first etch step at low pressure and moderately high power (1600 W) using oxygen ($O_2$) and a fluorine containing gas, such as $CHF_3$, followed by a second etch step at a low pressure etch and at a moderate power (about 500 W) in a plasma of a fluorine containing gas, such as $CF_4$, or $CHF_3$.

Figure 2F:
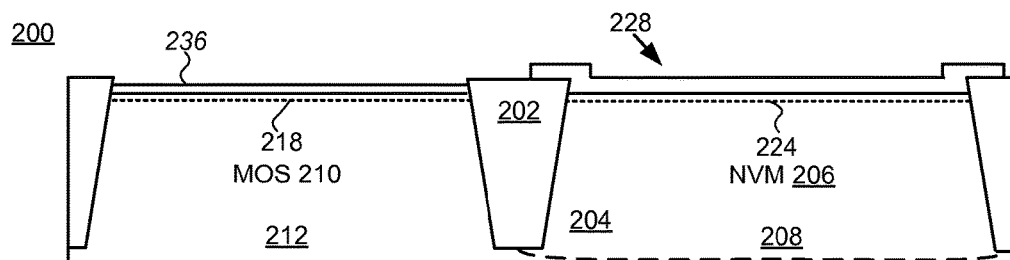

Referring to FIGS. 1 and 2F, a gate oxide or GOx preclean is performed, and a gate oxide or GOx 236 for the MOS transistor 210 formed in the MOS region 212 (step 110). The GOx preclean removes the pad oxide 214 from the MOS region 212. This cleaning process prepares the substrate 204 in the MOS region 212 for gate oxide growth. In one exemplary implementation the pad oxide 214 is removed in a wet clean process performed using a 20:1 BOE wet etch, a 50:1 hydrofluoric (HF) wet etch, a pad etch, or any other similar hydrofluoric-based wet etching chemistry. In other embodiments, the cleaning process chemistry is chosen so as to remove only a negligible portion of the blocking layer 234.

In some embodiments, the oxidation process to form gate oxides for multiple MOS transistors in the MOS region 212 is a dual gate oxidation process to enable fabrication of both a first, thick, gate oxide over the surface 216 of the substrate 204 in one MOS region 212 for a high voltage (HV) transistor, such as an input-output field effect transistor (I/O FET), and a second, thinner gate oxides for a low voltage (LV) transistor in another MOS region. It will be understood that the oxidation process to form the gate oxides 236 will have little to no detrimental impact on the blocking layer 234.

Figure 2G:
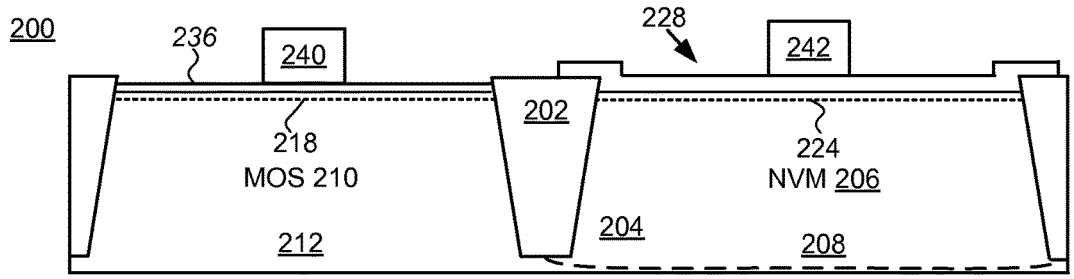

Next, referring to FIGS. 1 and 2G, a gate layer is deposited and patterned to concurrently form a gate 240 for the MOS transistor 210 and a gate 242 for the NVM transistor 206 (step 112). Generally, the gate layer is a conductive, conformal layer deposited over substantially the entire surface of the substrate 204 and all layers and structures formed thereon. A patterned photoresist mask (not shown) is then formed using standard lithographic techniques and the gate layer etched to remove the gate layer from areas not protected by the mask and stop on top surfaces of the gate oxide 236 and the dielectric stack (blocking layer 234).

In one embodiment, the gate layer includes a doped polysilicon or poly layer deposited using chemical vapor deposition (CVD) to a thickness of from about 30 nm to about 100 nm, and etched using standard polysilicon etch chemistries, such as $CHF_3$ or $C_2H_2$ or $HBr/O_2$ which are highly selective to the underlying material of the gate oxide 236 and the dielectric stack 228. The polysilicon can be doped using either Phosphorus or Boron for N-SONOS and P-SONOS respectively by ion implantation with energy in the range 20 KeV to 50 KEV and dose in the range of 1E15/cm2 to 5E15/cm2

Optionally, the gate layer may be a multi-layer gate layer including one or more layers of a high work function or P+ metal, such as aluminum, Titanium or compounds or alloys thereof, in addition to or instead of polysilicon.

Next, referring to FIG. 1 in those embodiments wherein the gate layer is or includes a polysilicon layer, the method further includes re-oxidizing the polysilicon to repair any damage incurred at edges of the gates 240, 242, during etching of the gate layer (step 114). The oxidized portion of the gates 240, 242, also serve as a passivating layer over the polysilicon and a screen for subsequent dopant implantations. In one embodiment the re-oxidation process can include exposing the substrate 204 with the polysilicon gates 240, 242, formed thereon to Oxygen at a temperature of from about 900° C. to about 1100° C., for at least about 5 to 30 minutes, to re-oxidize a portion of the polysilicon proximal to exposed surfaces of the gates to a depth of from about 1 to about 5 nm.

Figure 2H:
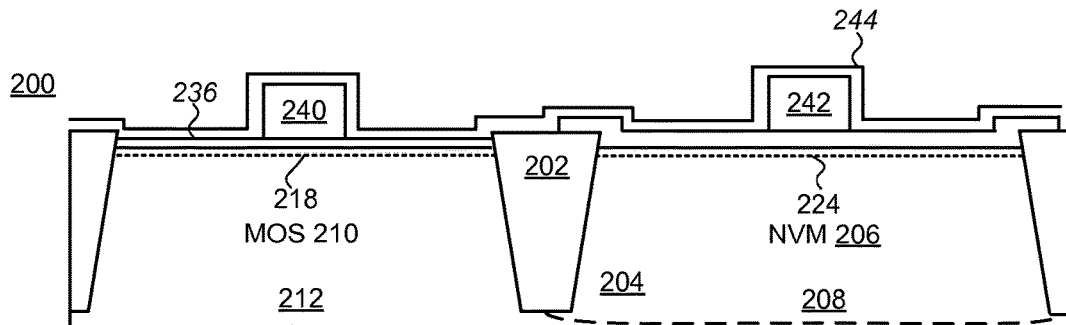
Figure 2I:
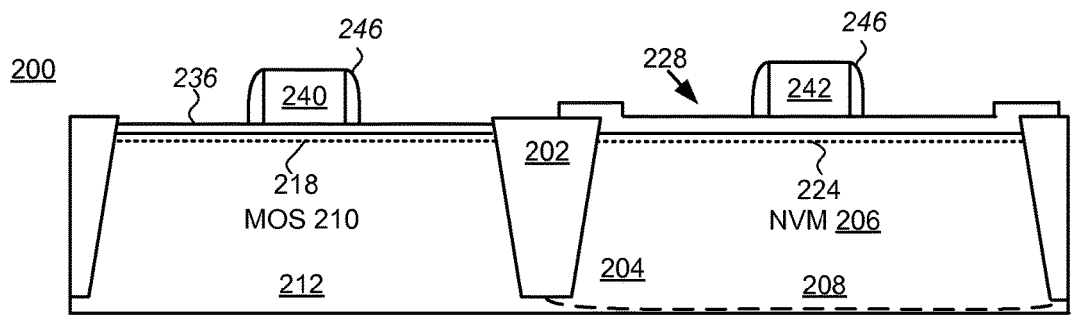

Referring to FIGS. 1 and 2H and 2I, a first spacer layer 244 is deposited and etched to form first sidewall spacers 246 (spacer 1) adjacent to the polysilicon gates 240, 242, of the MOS transistor 210 and the NVM transistor 206 (step 116). The first spacer layer 244 can include a conformal layer of a dielectric material, such as silicon oxide (SiO2) or silicon nitride (SiN), deposited to a thickness of from about 10 nm to about 30 nm, using any known CVD technique as described herein. In an embodiment, where the spacer layer 244 includes silicon nitride, the etch may be accomplished or performed in a number of different ways including, for example, a low pressure blanket or spacer etch at a moderate power (about 500 W) in a plasma of a fluorine containing gas, such as $CF_4$, or $CHF_3$. Because no mask is used and the etching is highly anisotropic, substantially all of the spacer layer 244 is etch or removed from exposed surfaces of the gate oxide 236 and the dielectric stack 228, as well as horizontal surface of the gates 240, 242, parallel to the surface 216 of the substrate 204 leaving first spacers 246 adjacent sidewalls of the gates of the of the MOS transistor 210 and the NVM transistor 206.

Figure 2J:
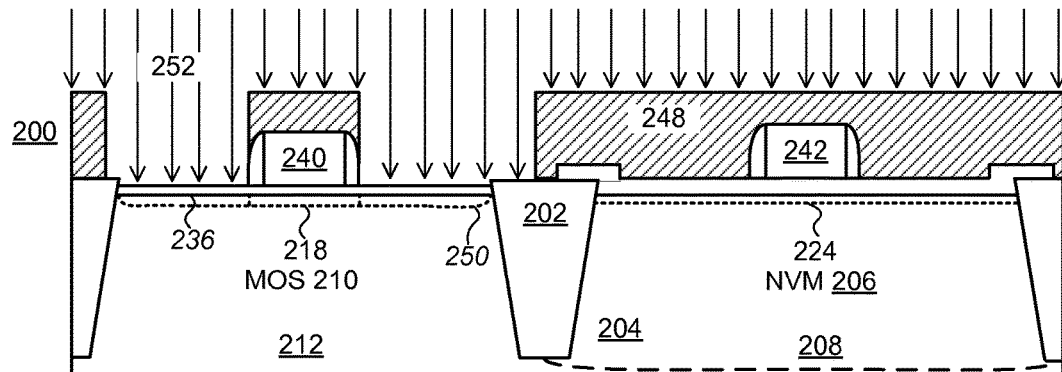

Next, referring to FIGS. 1 and 2J a MOS LDD mask 248 is deposited and patterned and drain extensions or LDDs 250 formed in source and drain (S/D) regions of the MOS transistor 210 by implanting an appropriate ion species (represented by arrows 252) at an appropriate energy, and to an appropriate concentration (step 118). For example, LDDs 250 for a P-type MOS transistor 210 can be formed by depositing a photoresist and patterning the photoresist using standard lithographic techniques to form openings in the MOS LDD mask 248 through which S/D regions of the MOS transistor 210 are exposed and implanting boron ions ($BF_2$) at an energy of from about 10 to about 100 kilo-electron volts (keV), and a dose of from about 1e12 $cm^{-2}$ to about 5e14 $cm^{-2}$ through the photoresist mask. Optionally, pocket or halo implants (not shown) for a P-type MOS transistor 210 can be formed through the same openings in the MOS LDD mask 248 by implanting Arsenic or Phosphorus at energy of 20 to 70 kilo-electron volts (KeV) and a dose of 2e12 $cm^{-2}$ to about 5e12 $cm^{-2}$. Similarly, LDDs 250 for a N-type MOS transistor 210 can be formed by implanting Arsenic or Phosphorus at energy of from about 10 to about 100 kilo-electron volts (keV), and a dose of from about 1e12 $m^{-2}$ to about 5e14 $cm^{-2}$, also through an appropriately patterned photoresist mask. Halo or pocket implants for the N-type MOS transistor 210 can also be done through this mask using Boron ($BF_2$) at energy of 5 to about 50 kilo-electron volts and a dose of 1e12 $cm^{-2}$ to 5e12 $cm^{-2}$.

Figure 2K:
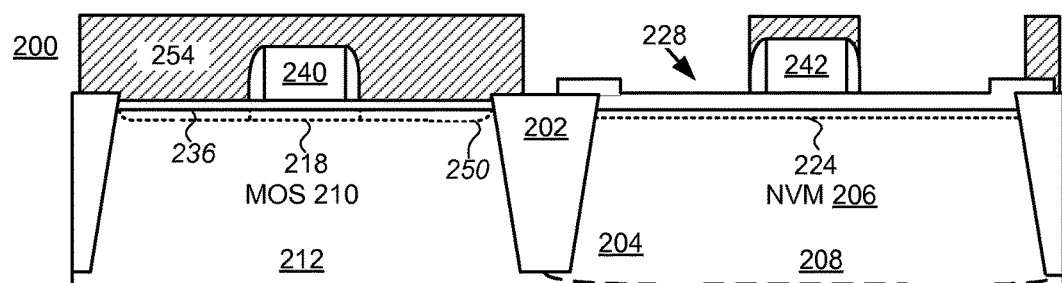

Referring to FIGS. 1 and 2K a mask 254, such as a ONO or NVM LDD mask, is formed over the substrate 204, exposing source and drain (S/D) regions of the NVM transistor 206 (step 120). The NVM LDD mask 254 can include a photoresist layer, or a hard mask formed, from a patterned nitride or silicon-nitride layer.

Figure 2L:
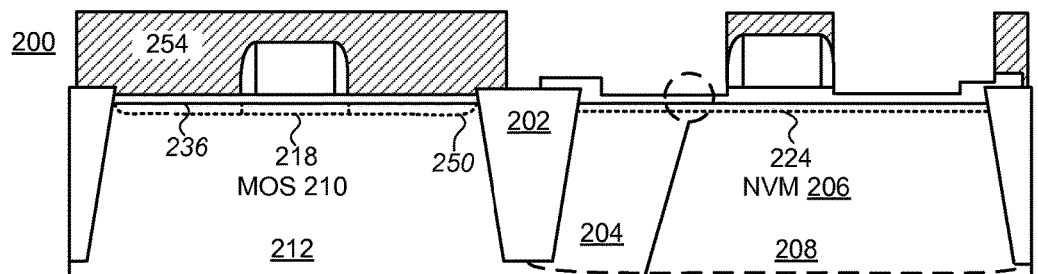
Figure 2M:
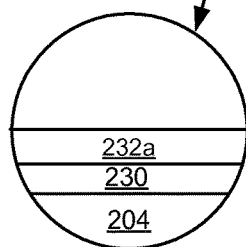

Next, referring to FIGS. 1 and 2L through 2M the dielectric stack 228 overlying the S/D regions and exposed through openings in the mask 254 is etched to thin the dielectric stack by removing the blocking layer 234 and at least a first portion of the charge-trapping layer 232 in S/D regions of the NVM transistor 206 (step 122). The dielectric stack 228 in S/D regions of the NVM transistor 206 is thinned from an initial total stack thickness of about 175 angstroms (Å), which adversely impact implants into the S/D regions, down to a thickness of from about 30 Å to about 40 Å, which would not. In some embodiments in the charge-trapping layer 232 is a multilayer charge-trapping layer including first and second charge-trapping layers 232a and 232b, substantially the entire upper, second charge-trapping layer 232b or about 90 Å of the charge-trapping layer is removed.

In one embodiment, the thinning is accomplished using a standard oxide etch, for example a wet etch process using a 10:1 buffered oxide etch (BOE) containing a surfactant. Alternatively, the wet etch process can be performed using a 20:1 BOE wet etch, a 50:1 hydrofluoric (HF) wet etch, a pad etch, or any other similar hydrofluoric-based wet etching chemistry. It is noted that while the above etch chemistry is selective to nitride, at the above concentrations it has been found to also etch the underlying silicon nitride or silicon-oxynitride of the charge-trapping layer 232, albeit at a slower rate.

Alternatively, the thinning of the dielectric stack 228 can be accomplished in a multi-step process in which the above oxide etch is followed by a nitride etch, for example, a low pressure etch at a moderate power (about 500 W) in a plasma of a fluorine containing gas, such as $CF_4$, or $CHF_3$.

In yet another alternative, the thinning of the dielectric stack 228 can be accomplished in a single or multi-step process in which the either the blocking layer 234 or both the blocking layer and at least a portion of the charge-trapping layer 232 are removed in a dry etch process. In one embodiment, where the blocking layer 234 includes an oxide and the charge-trapping layer 232 a silicon nitride or silicon oxynitride, the dry etch process can include, for example, a first etch step at low pressure and moderately high power (1600 W) using oxygen ($O_2$) and a fluorine containing gas, such as $CHF_3$, followed by a second, nitride etch step as described above.

Figure 2N:
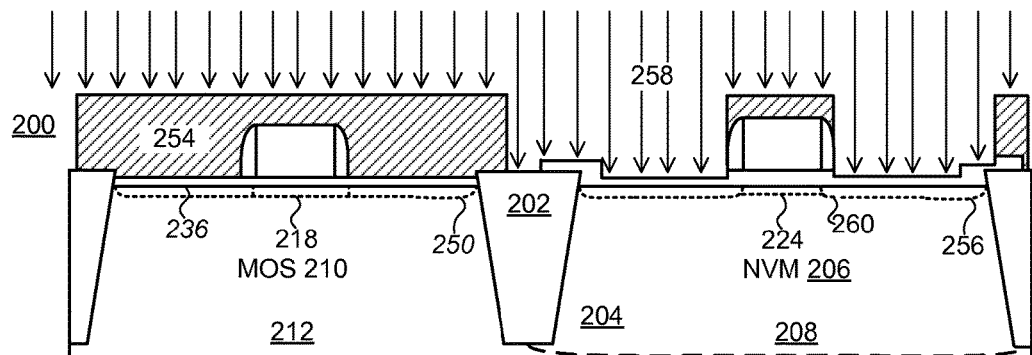

Next, referring to FIGS. 1 and 2N, drain extensions or LDDs 256 are formed in the S/D regions of the NVM transistor 206 by implanting an appropriate ion species (represented by arrows 258) at an appropriate energy, and to an appropriate concentration through openings in the aforementioned ONO or NVM LDD mask 254 (step 124), and NVM LDD mask 254 is removed. The photoresist NVM LDD mask 254 can be removed by ashing or stripping using oxygen plasma as described above. In one embodiment, the LDD implants 256 can be formed by implanting Arsenic or Phosphorous at an energy of from about 5 to about 25 kilo-electron volts (keV), and to a dose of from about 5 e12 $cm^{-2}$ to about 2 e14 $cm^{-2}$. Optionally, pocket or halo implants 260 for a P-type NVM transistor 206 can be formed through the same openings in the NVM LDD mask 254 by implanting Arsenic or Phosphorus at energy of 20 to 70 kilo-electron volts (KeV) and a dose of 1e12 $cm^{-2}$ to about 5e12 $cm^{-2}$. Similarly, pocket or halo implants 260 for a N-type NVM transistor 206 can be formed by implanting Boron with energy of 10 to 30 kilo-electron volts and a dose of 1e12 $cm^{-2}$ to 5e12 $cm^{-2}$.

Figure 2O:
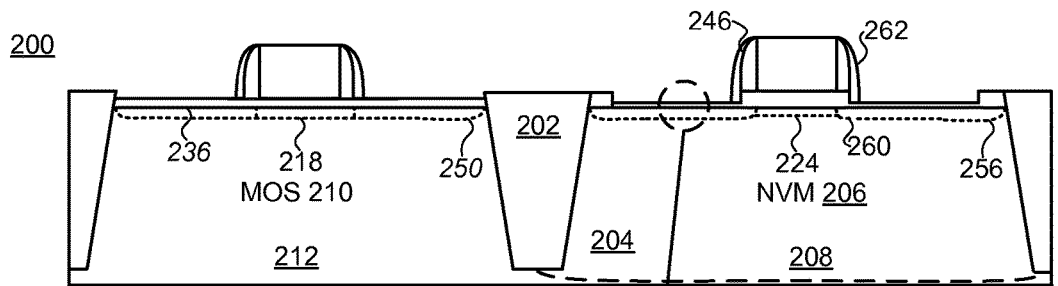
Figure 2P:
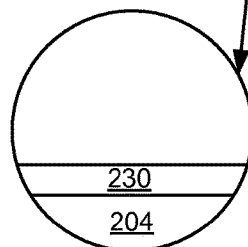

Next, referring to FIGS. 1 and 2O through 2P, a second spacer layer is deposited and etched to form second spacers 262 adjacent to the first sidewall spacers 246, of the NVM transistor and MOS transistors (step 126). The second spacer layer can include a conformal layer of a dielectric material, such as silicon oxide (SiO2) or silicon nitride (SiN), deposited to a thickness of from about 10 nm to about 50 nm, using any known CVD technique as described herein. As with the spacer etch for the first spacers 246 described above, no mask is used and because the etching is highly anisotropic, substantially all of the second spacer layer is etch or removed from exposed surfaces of the gate oxide 236 and the dielectric stack 228, as well as horizontal surface of the gates 240, 242, parallel to the surface 216 of the substrate 204 leaving second spacers 262 adjacent sidewalls of the gates of the MOS transistor 210 and the NVM transistor 206.

Optionally or preferably, the chemistry, power and duration of the etch used to form the second spacers 262 are chosen to further thin or remove a portion of the dielectric stack 228 in S/D regions of the NVM transistor 206. For example, in one embodiment, the second spacer layer includes silicon nitride and the etch is performed using a low pressure blanket or spacer etch at a moderate power (about 500 W) in a plasma of a fluorine containing gas, such as $CF_4$, or $CHF_3$, and substantially the entire lower, first charge-trapping layer 232a, or about 25 Å of the charge-trapping layer is removed, as shown in FIG. 2P.

Figure 2Q:
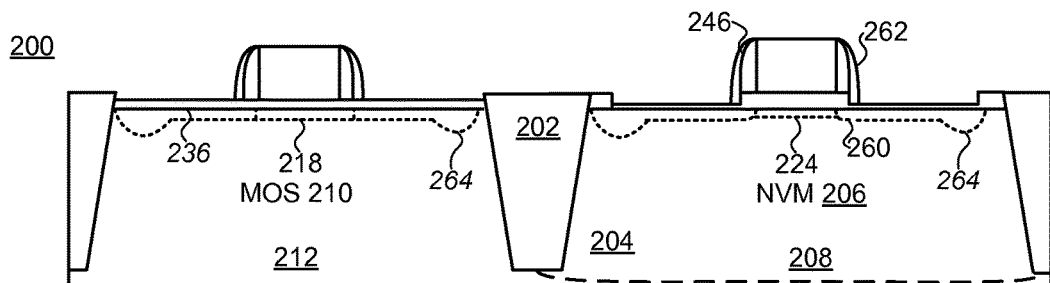
Figure 2R:
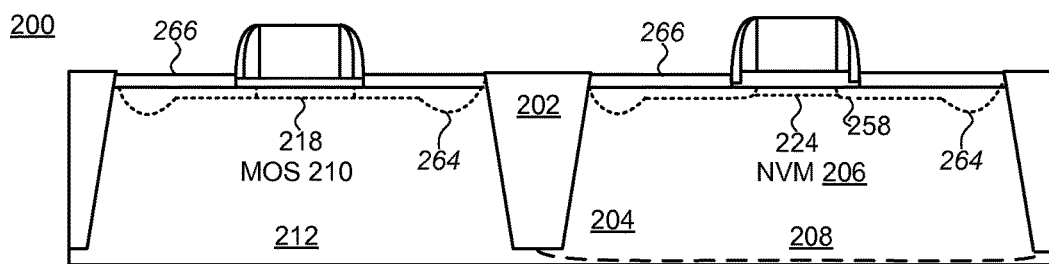

Referring to FIGS. 1 and 2Q, a patterned mask (not shown) is formed and deep source and drain implants are performed to form source and drain (S/D) regions 264 for both the NVM transistor 206 and the MOS transistor 210 (step 128). The patterned mask can include a photoresist mask or a hard mask patterned to expose only the S/D regions of the NVM transistor 206 and MOS transistor 210. For PMOS, Boron or BF2 is used at 20-50 KeV energy and dose of 2 to 5E15/$cm^2$. For NMOS, Phosphorus or Arsenic is used with energy in the 30-75 KeV and dose of 2 to 5E15/$cm^2$.

Referring to FIGS. 1 and 2R any of the dielectric stack 228 remaining in S/D regions of the NVM transistor 206 as well as any of the GOx 236 remaining in S/D regions of the MOS transistor 210 are removed, and a silicide 266 formed over the surface 216 of the substrate 204 in all S/D regions (step 130). Generally, the dielectric stack 228 and the GOx 236 can be removed by any of the oxide and/or nitride etches described herein. In one particular embodiment, the dielectric stack 228 and the GOx 236 are removed by a wet process using HF or standard cleans (SC1) and SC2 that are highly selective to the material of the substrate 204. SC1 is typically performed using a 1:1:5 solution of ammonium hydroxide ($NH_4OH$), hydrogen peroxide ($H_2O_2$) and water ($H_2O$) at 50 to 80° C. for about 10 minutes. SC2 is a short immersion in a 1:1:10 solution of HCl, $H_2O_2$ and $H_2O$ at about 50 to 80° C. Removal of any of the dielectric stack 228 and the GOx 236 remaining on the surface 216 of the substrate 204 in the S/D regions at the time of silicide formation is desirable because otherwise the silicidation reaction between a metal used to form the silicide and the silicon of the substrate is blocked and no silicide will be formed. The silicide process may be any commonly employed in the art, typically including a pre-clean etch, nickel metal deposition, anneal and wet strip. Followed by a second anneal.

Finally, the standard or baseline CMOS process flow is continued to substantially complete the front end device fabrication of the memory cell 200.

Figure 3:
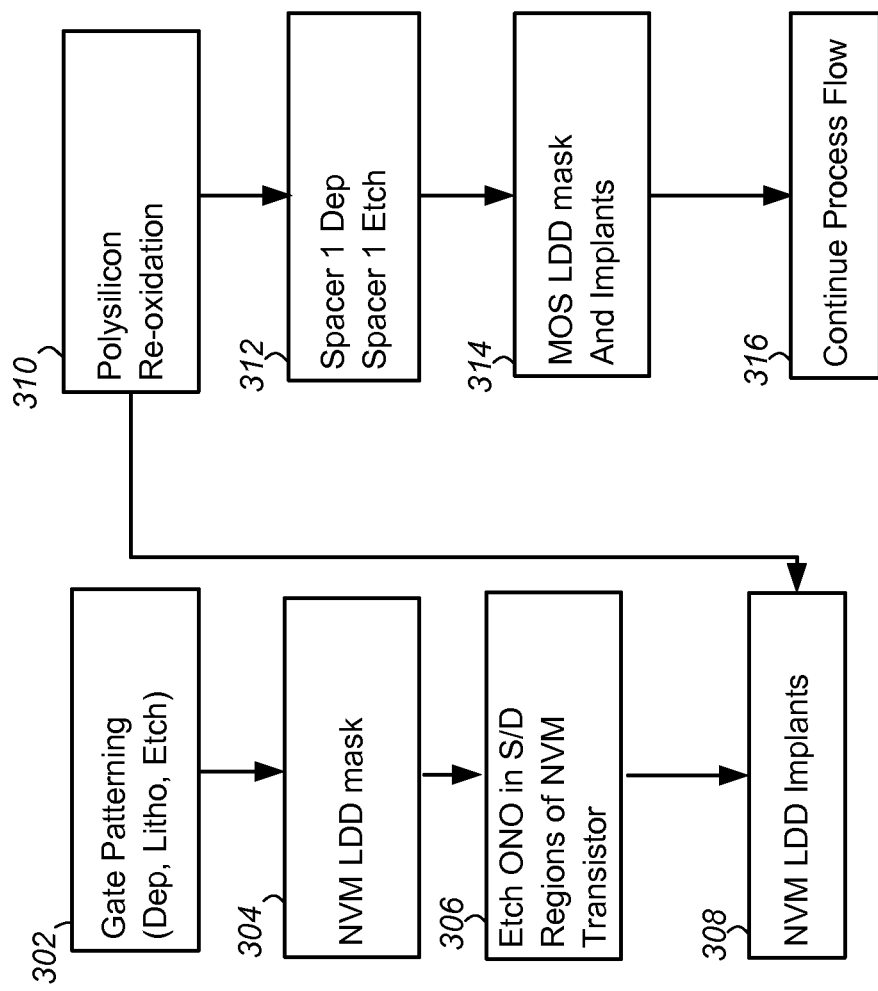
FIG. 3 is a flowchart illustrating another embodiment of a method for fabricating a memory cell including a NVM transistor and MOS transistor using a NVM LDD mask, and including forming a first spacer prior to forming a LDD adjacent to a gate of the NVM transistor.

Another embodiment of a method for integrating or embedding a NVM transistor into a CMOS process flow will now be described in detail with reference to FIG. 3 and FIGS. 4A through 4G. FIG. 3 is a flowchart illustrating an embodiment of a method or process flow in which the LDD mask for the NVM transistor, or NVM LDD mask, is used to thin if not remove a dielectric stack from S/D regions of the NVM transistor before implanting ions into S/D regions, and in which first spacers (spacer 1) are formed adjacent to sidewalls of gates of the NVM and MOS transistors after thinning the dielectric stack. FIGS. 4A through 4G are block diagrams illustrating cross-sectional views of a portion of a memory cell 200, including a NVM transistor and MOS transistors, during fabrication of the memory cell according to the method of FIG. 3.

As with the method or process flow described above the process begins with forming a number of isolation structures 202 in a wafer or substrate 204, implanting dopants into substrate 204 through the pad oxide 214 form wells in one or more of the NVM or MOS regions, and to form channels for the NVM and MOS transistors that will be formed in the MOS regions, all as described in steps 102 through 106 of FIG. 1 and FIGS. 2A through 2C. Next, a dielectric stack 228 is deposited and patterned as described in step 108 and shown in FIGS. 2D and 2E. Finally, a GOx preclean is performed and a GOx 236 deposited as described in step 108 and shown in FIG. 2F. At this point the memory cell 200 is substantially identical to that shown in FIG. 2F and described above.

Figure 4A:
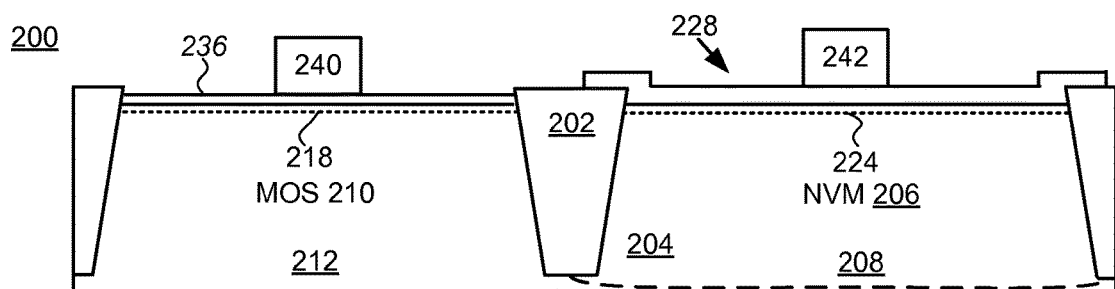
FIGS. 4A-4G are block diagrams illustrating cross-sectional views of a portion of a memory cell during fabrication of the memory cell according to the method of FIG. 3.

Referring to FIGS. 3 and 4A, the method continues with the deposition and patterning of a gate layer (not shown) to concurrently form the gate 240 for the MOS transistor 210 and the gate 242 for the NVM transistor 206 (step 302). Generally, the gate layer is a conductive, conformal layer deposited over substantially the entire surface of the substrate 204 and all layers and structures formed thereon. A patterned photoresist mask (not shown) is then formed using standard lithographic techniques and the gate layer etched to remove the gate layer from areas not protected by the mask and stop on top surfaces of the gate oxide 236 and the dielectric stack (blocking layer 234).

As described above, the gate layer can include a doped polysilicon layer and/or one or more metal layer.

Figure 4B:
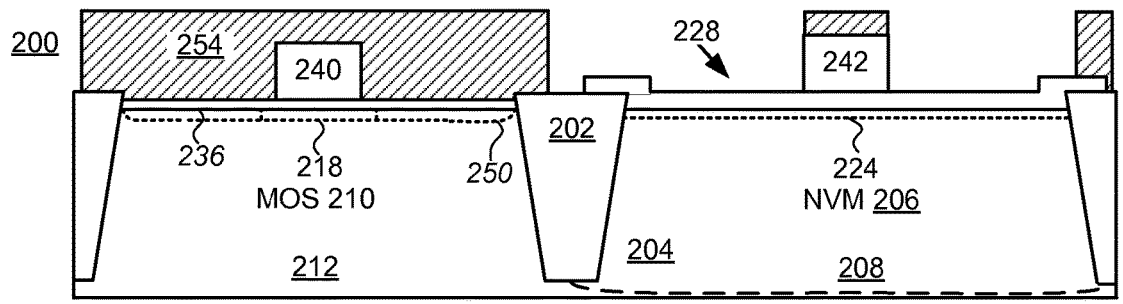

Referring to FIGS. 3 and 4B a mask 254, such as a ONO or NVM LDD mask, is formed over the substrate 204, exposing source and drain (S/D) regions of the NVM transistor 206 (step 304).

Figure 4C:
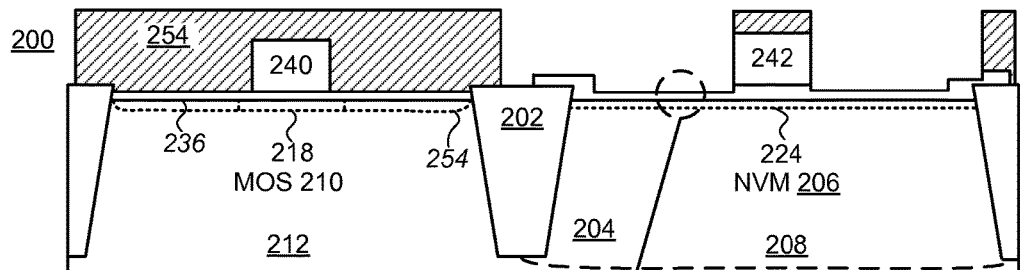
Figure 4D:
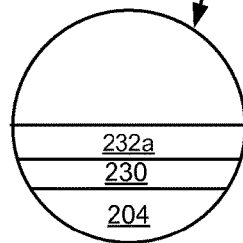

Next, referring to FIGS. 3 and 4C through 4D the dielectric stack 228 overlying the S/D regions and exposed through openings in the mask 254 is etched to thin the dielectric stack by removing the blocking layer 234 and at least a first portion of the charge-trapping layer 232 in S/D regions of the NVM transistor 206 (step 306). As described above, the dielectric stack 228 in S/D regions of the NVM transistor 206 is thinned from an initial total stack thickness of about 175 Å, which adversely impact implants into the S/D regions, down to a thickness of from about 30 Å to about 40 Å, which would not. In some embodiments in the charge-trapping layer 232 is a multilayer charge-trapping layer including first and second charge-trapping layers 232a and 232b, substantially the entire upper, second charge-trapping layer 232b or about 90 Å of the charge-trapping layer is removed.

In one embodiment, the thinning is accomplished using a standard oxide etch, for example a wet etch process using a 10:1 BOE containing a surfactant. Alternatively, the wet etch process can be performed using a 20:1 BOE wet etch, a 50:1 HF wet etch, a pad etch, or any other similar hydrofluoric-based wet etching chemistry. It is noted that while the above etch chemistry is selective to nitride, at the above concentrations it has been found to also etch the underlying silicon nitride or silicon-oxynitride of the charge-trapping layer 232, albeit at a slower rate.

Alternatively, the thinning of the dielectric stack 228 can be accomplished in a multi-step process in which the above oxide etch is followed by a nitride etch, for example, a low pressure etch at a moderate power (about 500 W) in a plasma of a fluorine containing gas, such as $CF_4$, or $CHF_3$.

In yet another alternative, the thinning of the dielectric stack 228 can be accomplished in a single or multi-step process in which the either the blocking layer 234 or both the blocking layer and at least a portion of the charge-trapping layer 232 are removed in a dry etch process. In one embodiment, where the blocking layer 234 includes an oxide and the charge-trapping layer 232 a silicon nitride or silicon oxynitride, the dry etch process can include, for example, a first etch step at low pressure and moderately high power (1600 W) using oxygen ($O_2$) and a fluorine containing gas, such as $CHF_3$, followed by a second, nitride etch step as described above.

Figure 4E:
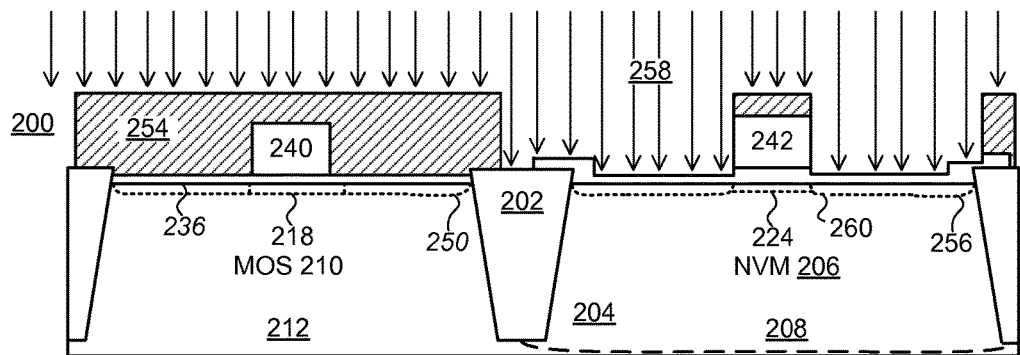

Next, referring to FIGS. 3 and 4E, drain extensions or LDDs 256 are formed in the S/D regions of the NVM transistor 206 by implanting an appropriate ion species (represented by arrows 258) at an appropriate energy, and to an appropriate concentration through openings in the aforementioned ONO or NVM LDD mask 254 (step 308), and NVM LDD mask 254 is removed. As described above, the photoresist NVM LDD mask 254 can be removed by ashing or stripping using oxygen plasma. In one embodiment, the LDD implants 256 can be formed by implanting Arsenic or Phosphorous at an energy of from about 5 to about 25 kilo-electron volts (keV), and to a dose of from about 5 e12 $cm^2$ to about 2 e14 $cm^2$. Optionally, pocket or halo implants 260 for a P-type NVM transistor 206 can be formed through the same openings in the NVM LDD mask 254 by implanting Arsenic or Phosphorus at energy of 20 to 70 kilo-electron volts (KeV) and a dose of 2e12 $cm^{-2}$ to about 5e12 $cm^{-2}$. Similarly, pocket or halo implants 260 for a N-type NVM transistor 206 can be formed by implanting ($BF_2$) with energy of 10 to 30 kilo-electron volts and a dose of 1e12 $cm^{-2}$ to 3e12 $cm^{-2}$.

In those embodiments in which the gate layer is or includes a polysilicon layer, the polysilicon can be re-oxidized to repair any damage incurred at edges of the gates 240, 242, during etching of the gate layer or thinning the dielectric the dielectric stack in S/D regions of the NVM transistor 206 (step 310). In one embodiment the re-oxidation process can include exposing the substrate 204 with the polysilicon gates 240, 242, formed thereon to Oxygen at a temperature of from about 900° C. to about 1100° C., for at least about 5 to 30 minutes, to re-oxidize a portion of the polysilicon proximal to exposed surfaces of the gates to a depth of from about 1 to about 5 nm.

Figure 4F:
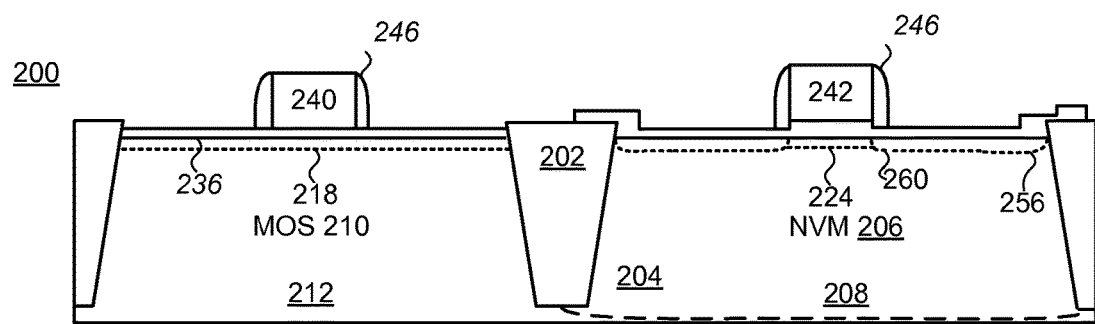

Referring to FIGS. 3 and 4F, a first spacer layer (not shown in this figure) is deposited and etched to form first sidewall spacers 246 (spacer 1) adjacent to the polysilicon gates 240, 242, of the MOS transistor 210 and the NVM transistor 206 (step 312). As described above, the first spacer layer 244 can include a conformal layer of a dielectric material, such as silicon oxide (SiO2) or silicon nitride (SiN), deposited to a thickness of from about 10 nm to about 30 nm, using any known CVD technique as described herein. In an embodiment, where the spacer layer 244 includes silicon nitride, the etch may be accomplished or performed in a number of different ways including, for example, a low pressure blanket or spacer etch at a moderate power (about 500 W) in a plasma of a fluorine containing gas, such as $CF_4$, or $CHF_3$. Because no mask is used and the etching is highly anisotropic, substantially all of the spacer layer 244 is etch or removed from exposed surfaces of the gate oxide 236 and the dielectric stack 228, as well as horizontal surface of the gates 240, 242, parallel to the surface 216 of the substrate 204 leaving first spacers 246 adjacent sidewalls of the gates of the of the MOS transistor 210 and the NVM transistor 206.

Figure 4G:
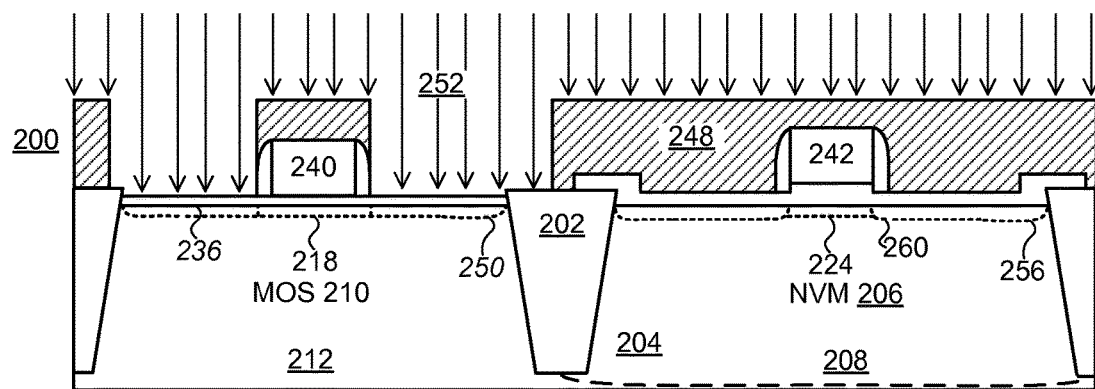

Next, referring to FIGS. 3 and 4G a MOS LDD mask 248 is deposited and patterned and drain extensions or LDDs 250 formed in source and drain (S/D) regions of the MOS transistor 210 by implanting an appropriate ion species (represented by arrows 252) at an appropriate energy, and to an appropriate concentration (step 314). As described above, LDDs 250 for a P-type MOS transistor 210 can be formed by implanting boron ions ($BF_2$) at an energy of from about 10 to about 100 kilo-electron volts (keV), and a dose of from about 1e12 cm$^{-2}$ to about 5e14 cm$^{-2}$, and LDDs for a N-type MOS transistor can be formed by implanting Arsenic or Phosphorus at energy of from about 10 to about 100 kilo-electron volts (keV), and a dose of from about 1e12 m$^{-2}$ to about 5e14 cm$^{-2}$ photoresist mask. Optionally, pocket or halo implants (not shown) for the MOS transistor 210 can be formed by implanting an appropriate ion species at an appropriate energy, and to an appropriate concentration as described above.

Finally, deep source and drain implants are performed to form source and drain (S/D) regions 264 for both the NVM transistor 206 and the MOS transistor 210, any of the dielectric stack 228 remaining in S/D regions of the NVM transistor 206 as well as any of the GOx 236 remaining in S/D regions of the MOS transistor 210 are removed, a silicide 266 formed over the surface 216 of the substrate 204 in all S/D regions, and the standard or baseline CMOS process flow is continued to substantially complete the front end device fabrication of the memory cell 200 (step 316). As noted above, the dielectric stack 228 and the GOx 236 can be removed by any of the oxide and/or nitride etch described herein, including a wet process using HF or standard cleans (SC1) and SC2. The silicide process may be any commonly employed in the art, typically including a pre-clean etch, nickel metal deposition, anneal and wet strip.

Figure 5:
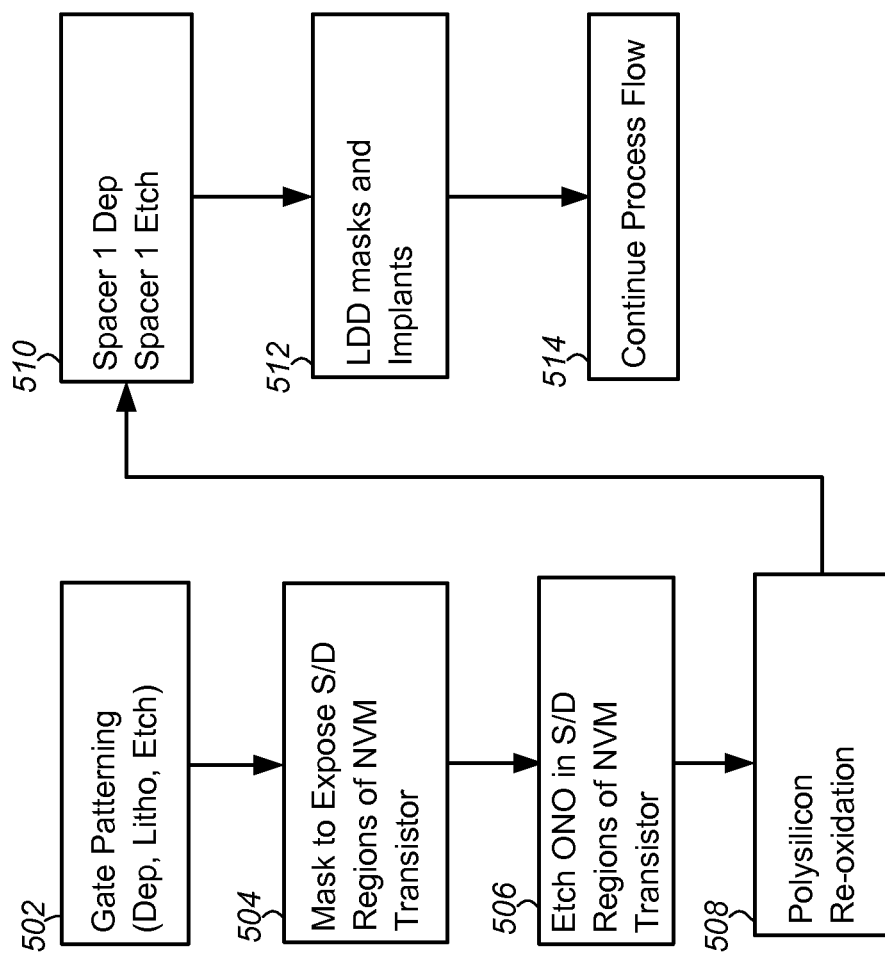
FIG. 5 is a flowchart illustrating another embodiment of a method for fabricating a memory cell including a NVM transistor and MOS transistor using a separate mask to remove or thin the dielectric stack.

Another embodiment of a method for integrating or embedding a NVM transistor into a CMOS process flow will now be described in detail with reference to FIG. 5 and FIGS. 6A through 6E. FIG. 5 is a flowchart illustrating an embodiment of a method or process flow in which a separate mask, other than the NVM LDD mask 254, is used to thin if not remove a dielectric stack from S/D regions of the NVM transistor before forming first spacers (spacer 1) adjacent to sidewalls of gates of the NVM and MOS transistors and implanting ions into S/D regions of the NVM transistor to form LDD 256. FIGS. 6A through 6E are block diagrams illustrating cross-sectional views of a portion of a memory cell 200, including a NVM transistor and MOS transistors, during fabrication of the memory cell according to the method of FIG. 5.

As with the methods or process flows described above the process begins with forming a number of isolation structures 202 in a wafer or substrate 204, implanting dopants into substrate 204 through the pad oxide 214 form wells in one or more of the NVM or MOS regions, and to form channels for the NVM and MOS transistors that will be formed in the MOS regions, all as described in steps 102 through 106 of FIG. 1 and FIGS. 2A through 2C. Next, a dielectric stack 228 is deposited and patterned as described in step 108 and shown in FIGS. 2D and 2E. Finally, a GOx preclean is performed and a GOx 236 deposited as described in step 108 and shown in FIG. 2F. At this point the memory cell 200 is substantially identical to that shown in FIG. 2F and described above.

Figure 6A:
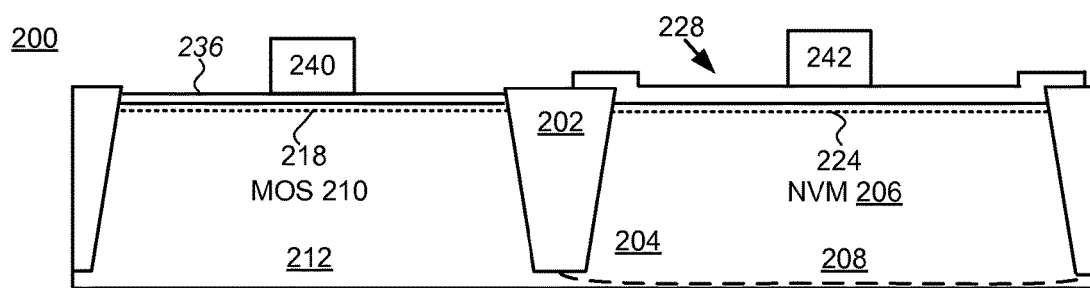
FIGS. 6A-6E are block diagrams illustrating cross-sectional views of a portion of a memory cell during fabrication of the memory cell according to the method of FIG. 5.

Referring to FIGS. 5 and 6A, the method continues with the deposition and patterning of a gate layer (not shown) to concurrently form the gate 240 for the MOS transistor 210 and the gate 242 for the NVM transistor 206 (step 502). Generally, the gate layer is a conductive, conformal layer deposited over substantially the entire surface of the substrate 204 and all layers and structures formed thereon. A patterned photoresist mask (not shown) is then formed using standard lithographic techniques and the gate layer etched to remove the gate layer from areas not protected by the mask and stop on top surfaces of the gate oxide 236 and the dielectric stack (blocking layer 234). As described above, the gate layer can include a doped polysilicon layer and/or one or more metal layer.

Figure 6B:
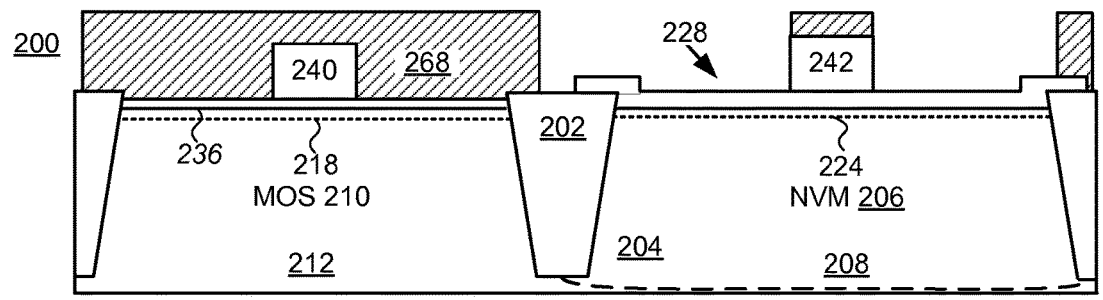
Figure 6C:
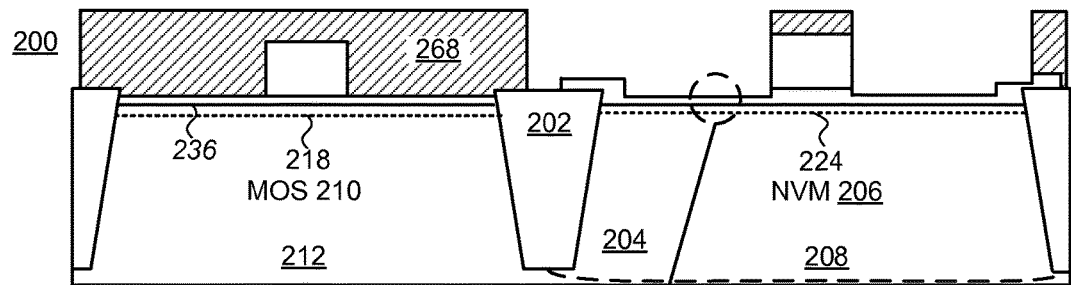
Figure 6D:
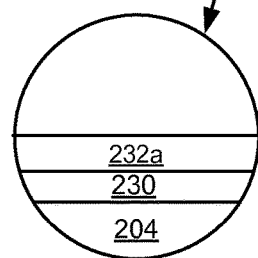

Referring to FIGS. 5 and 6B a mask 268 is formed over the substrate 204, exposing source and drain (S/D) regions of the NVM transistor 206 (step 504). As with the NVM LDD mask 254 described above, the mask 268 can include a photoresist layer, or a hard mask formed, from a patterned nitride or silicon-nitride layer. In the embodiment shown the mask 268 is includes a layer of photoresist patterned using standard photolithographic processes.

Next, referring to FIGS. 5 and 4C through 6D the dielectric stack 228 overlying the S/D regions and exposed through openings in the mask 268 are etched to thin the dielectric stack by removing the blocking layer 234 and at least a first portion of the charge-trapping layer 232 in S/D regions of the NVM transistor 206 (step 506). As described above, the dielectric stack 228 in S/D regions of the NVM transistor 206 is thinned from an initial total stack thickness of about 175 Å, which adversely impact implants into the S/D regions, down to a thickness of from about 30 Å to about 40 Å, which would not adversely impact subsequent implanting of dopants into S/D regions of the NVM transistor. In some embodiments the charge-trapping layer 232 is a multilayer charge-trapping layer including first and second charge-trapping layers 232a and 232b, substantially the entire upper, second charge-trapping layer 232b or about 90 Å of the charge-trapping layer is removed.

In one embodiment, the thinning is accomplished using a standard oxide etch, for example a wet etch process using a 10:1 BOE containing a surfactant. Alternatively, the wet etch process can be performed using a 20:1 BOE wet etch, a 50:1 HF wet etch, a pad etch, or any other similar hydrofluoric-based wet etching chemistry. It is noted that while the above etch chemistry is selective to nitride, at the above concentrations it has been found to also etch the underlying silicon nitride or silicon-oxynitride of the charge-trapping layer 232, albeit at a slower rate.

Alternatively, the thinning of the dielectric stack 228 can be accomplished in a multi-step process in which the above oxide etch is followed by a nitride etch, for example, a low pressure etch at a moderate power (about 500 W) in a plasma of a fluorine containing gas, such as $CF_4$, or $CHF_3$.

In yet another alternative, the thinning of the dielectric stack 228 can be accomplished in a single or multi-step process in which the either the blocking layer 234 or both the blocking layer and at least a portion of the charge-trapping layer 232 are removed in a dry etch process. In one embodiment, where the blocking layer 234 includes an oxide and the charge-trapping layer 232 a silicon nitride or silicon oxynitride, the dry etch process can include, for example, a first etch step at low pressure and moderately high power (1600 W) using oxygen ($O_2$) and a fluorine containing gas, such as $CHF_3$, followed by a second, nitride etch step as described above.

Next, the mask 268 removed, and, in those embodiments in which the gate layer is or includes a polysilicon layer, the polysilicon can be re-oxidized to repair any damage incurred at edges of the gates 240, 242, during etching of the gate layer (step 508). As described above, mask 268 can be removed by ashing or stripping using oxygen plasma. The re-oxidation process can include exposing the substrate 204 with the polysilicon gates 240, 242, formed thereon to an Oxygen at a temperature of from about 900° C. to 1100° C., for at least about 5 to 30 minutes, to re-oxidize a portion of the polysilicon proximal to exposed surfaces of the gates to a depth of from about 1 to about 5 nm.

Figure 6E:
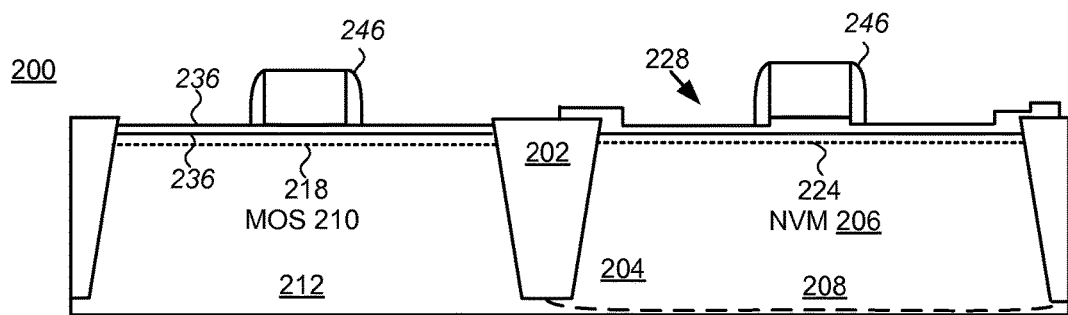

Referring to FIGS. 5 and 6E, a first spacer layer (not shown in this figure) is deposited and etched to form first sidewall spacers 246 (spacer 1) adjacent to the polysilicon gates 240, 242, of the MOS transistor 210 and the NVM transistor 206 (step 510). As described above, the first spacer layer 244 can include a conformal layer of a dielectric material, such as silicon oxide (SiO2) or silicon nitride (SiN), deposited to a thickness of from about 10 nm to about 30 nm, using any known CVD technique as described herein. In an embodiment, where the spacer layer 244 includes silicon nitride, the etch may be accomplished or performed in a number of different ways including, for example, a low pressure blanket or spacer etch at a moderate power (about 500 W) in a plasma of a fluorine containing gas, such as $CF_4$, or $CHF_3$. Because no mask is used and the etching is highly anisotropic, substantially all of the spacer layer 244 is etch or removed from exposed surfaces of the gate oxide 236 and the dielectric stack 228, as well as horizontal surface of the gates 240, 242, parallel to the surface 216 of the substrate 204 leaving first spacers 246 adjacent sidewalls of the gates of the of the MOS transistor 210 and the NVM transistor 206.

Next, MOS LDD masks and NVM LDD masks can be sequentially formed over the surface 216 of the substrate 204, and the appropriate implants made to form lightly doped drain extensions (LDDs 250 and 256) and pocket or halo implants 260 for the MOS and NVM transistors, as described in steps 118 and 124 above.

Finally, deep source and drain implants are performed to form source and drain (S/D) regions 264 for both the NVM transistor 206 and the MOS transistor 210, and any of the dielectric stack 228 remaining in S/D regions of the NVM transistor 206 as well as any of the GOx 236 remaining in S/D regions of the MOS transistor 210 are removed. A silicide 266 can then be formed over the surface 216 of the substrate 204 in all S/D regions, and the standard or baseline CMOS process flow is continued to substantially complete the front end device fabrication of the memory cell 200 (step 514).

Although embodiments of this method use a separate mask to thin the dielectric stack over the S/D regions of the NVM transistor, the use of the separate mask and the polysilicon re-oxidation (step 508) being performed after the thinning greatly reduces etch defects in the underlying layers. Also, it will be understood that the separate mask 268, can be formed or patterned using the same reticule as is used to form the NVM LDD mask 254, thereby avoiding much of the expense of introducing an additional mask into the process flow.

Thus, embodiments of methods for fabricating memory cells including embedded or integrally formed ONO based NVM transistor and MOS transistors have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method comprising:
    forming a channel of a transistor in a surface of a substrate;
    forming a dielectric stack including a first oxide layer overlying the surface of the substrate, a middle layer comprising nitride overlying the first oxide layer and a second oxide layer overlying the middle layer;
    forming a gate of the transistor over the dielectric stack and channel;
    forming spacers adjacent sidewalls of the gate;
    forming over the spacers, gate and the dielectric stack a mask exposing source and drain (S/D) regions of the transistor;
    etching the dielectric stack through the mask to thin the dielectric stack by removing the second oxide layer and at least a first portion of the middle layer in S/D regions of the transistor; and
    implanting dopants into S/D regions of the transistor through the thinned dielectric stack to form a lightly-doped drain (LDD) adjacent to the channel of the transistor.

2. The method of claim 1 wherein the middle layer is a charge-trapping layer.

3. The method of claim 2 wherein the charge-trapping layer is a multi-layer charge-trapping layer comprising at least a first charge-trapping layer overlying the first oxide layer and a second charge-trapping layer overlying the first charge-trapping layer, and wherein removing the at least a first portion of the middle layer comprises removing the second charge-trapping layer in S/D regions of the transistor.

4. The method of claim 3 wherein at least one of the first charge-trapping layer and the second charge-trapping layer comprises silicon-nitride or silicon-oxynitride.

5. The method of claim 1 wherein the transistor is a non-volatile memory (NVM) transistor.

6. The method of claim 1 wherein the first oxide layer is a tunneling layer and the second oxide layer is a blocking layer.

7. The method of claim 1 further comprising depositing and patterning a gate layer over the dielectric stack prior to forming the mask over the dielectric stack to form a gate of the transistor.

8. A method comprising:
    depositing and patterning a gate layer over a dielectric stack on a substrate to form a gate of a transistor, the dielectric stack including a first oxide layer overlying the surface of the substrate, a nitride layer overlying the first oxide layer and a second oxide layer overlying the nitride layer;

forming over the dielectric stack a mask exposing source and drain (S/D) regions of the transistor;

etching the dielectric stack through the mask to thin the dielectric stack by removing the second oxide layer and at least a first portion of the nitride layer in S/D regions of the transistor;

implanting dopants into S/D regions of the transistor through the thinned dielectric stack to form a lightly-doped drain (LDD) adjacent to the gate of the transistor; and depositing a spacer layer over the gate of the transistor and the surface of the substrate, and anisotropically etching the spacer layer to form spacers adjacent sidewalls of the gate of the transistor, wherein depositing and etching the spacer layer to form spacers is done prior to forming the mask over the dielectric stack.

9. The method of claim 8 wherein the nitride layer is a charge-trapping layer.

10. The method of claim 9 wherein the charge-trapping layer is a multi-layer charge-trapping layer comprising at least a first charge-trapping layer overlying the first oxide layer and a second charge-trapping layer overlying the first charge-trapping layer, and wherein removing the at least a first portion of the nitride layer comprises removing the second charge-trapping layer in S/D regions of the transistor.

11. The method of claim 10 wherein at least one of the first charge-trapping layer and the second charge-trapping layer comprises silicon-nitride or silicon-oxynitride.

12. The method of claim 8 wherein the transistor is a non-volatile memory (NVM) transistor.

13. The method of claim 8 wherein the first oxide layer is a tunneling layer and the second oxide layer is a blocking layer.

14. A method comprising:

forming a dielectric stack including a tunneling layer overlying a surface of a substrate, a charge-trapping layer overlying the tunneling layer and a blocking layer overlying the charge-trapping layer;

forming a gate of a transistor over the dielectric stack;

forming spacers adjacent sidewalls of the gate;

forming over the spacers, gate and the dielectric stack a mask exposing source and drain (S/D) regions of the transistor;

etching the dielectric stack through the mask to thin the dielectric stack by removing the blocking layer and at least a portion of the charge-trapping layer in S/D regions of the transistor; and implanting dopants into S/D regions of the transistor through the thinned dielectric stack to form a lightly-doped drain (LDD) adjacent to the gate of the transistor.

15. The method of claim 14 wherein the charge-trapping layer is a multi-layer charge-trapping layer comprising at least a first charge-trapping layer overlying the tunneling layer and a second charge-trapping layer overlying the first charge-trapping layer, and wherein removing the at least a portion of the charge-trapping comprises removing the second charge-trapping layer in S/D regions of the transistor.

16. The method of claim 14 wherein the dielectric stack comprises an oxide-nitride-oxide (ONO) stack and the transistor comprises a silicon-oxide-nitride-oxide-silicon (SONOS) transistor.

17. The method of claim 14 wherein at least one of the tunneling layer or the blocking layer comprises a high-k material.

* * * * *